United States Patent

Kuo et al.

[11] Patent Number: 6,093,646
[45] Date of Patent: Jul. 25, 2000

[54] MANUFACTURING METHOD FOR A THIN FILM WITH AN ANTI-REFLECTION ROUGH SURFACE

[75] Inventors: Jacky Kuo, Taipei; Mark Lin, Yungkang; Steven Hsiao, Taipei, all of Taiwan

[73] Assignee: United Semiconductor Corp., Hsin-Chu, Taiwan

[21] Appl. No.: 09/033,113

[22] Filed: Mar. 2, 1998

[30] Foreign Application Priority Data

Nov. 25, 1997 [TW] Taiwan ................................. 86117696

[51] Int. Cl.[7] ..................................................... H01L 21/44
[52] U.S. Cl. ......................... 438/684; 438/665; 438/683; 438/669
[58] Field of Search ..................................... 438/659, 657, 438/684, 663, 660, 669, 665, 683

[56] References Cited

U.S. PATENT DOCUMENTS

| | | |
|---|---|---|
| 5,324,684 | 6/1994 | Kermani et al. . |
| 5,604,157 | 2/1997 | Dai et al. . |
| 5,888,295 | 3/1999 | Sandhu et al. ............................. 117/89 |

*Primary Examiner*—Caridad Everhart
*Attorney, Agent, or Firm*—Merchant & Gould P.C.

[57] ABSTRACT

The present invention provides a manufacturing method for a poly film with an anti-reflection rough surface is provided. The method comprises steps of, at first, a thin film is formed over a substrate, and a amorphous silicon layer is formed over the thin film. Next, in situ a first annealing procedure is performed over the amorphous silicon layer. The amorphous silicon layer is changed into a polysilicon layer with the anti-reflection rough surface. Next, in situ a second annealing procedure is selectively performed. The polysilicon layer with the anti-reflection rough surface is doped by reacting with a gas induced. Then, the thin film and the polysilicon layer with the anti-reflection rough surface is defined, whereby the poly film with an anti-reflection rough surface is formed over the substrate.

16 Claims, 4 Drawing Sheets

MANUFACTURING METHOD FOR A THIN FILM WITH AN ANTI-REFLECTION ROUGH SURFACE

CROSS-REFERENCE TO RELATED APPLICATION

This application claims the priority benefit of Taiwan application serial no. 861 17696, filed Nov. 25, 1997, the full disclosure of which is incorporated herein by reference.

BACKGROUND OF THE INVENTION

1. Field of the Invention

This invention relates to a photolithography technique in a manufacturing process of a semiconductor device, and more particularly, to a manufacturing method of a polysilicon film with rough-surface.

2. Description of Related Art

The technique of the photolithography is a very important step in the manufacturing process of the semiconductor device. The basic steps for the photolithography process include steps of coating, exposure, and developing. The step of exposure almost uses light as the medium for transferring of the pattern of a mask. As to reasons for effecting the ultimate resolution of the exposure, it depends on wavelength of the light source employed. Generally, the shorter the wavelength of the light source is, the smaller the resolution of the exposure is.

In the commercial applications of the photolithography technique, the wavelength of the light source used in common is so-called G-line and I-line. The wavelength of the G-line is 4360 Å, and the wavelength of the I-line is 3650 Å. Another light source of a krypton fluoride laser provides a deep ultra-violet ray with 2480 Å. The new light source can satisfy demands for the next-generation 64M bits DRAM. Therefore, accompanying the continually diminishing of the design rules, the wavelength of the light source used in photolithography process has to be decreased at the some time.

However, when a shorter wavelength of the light source is selected, the strength of refraction of the thin film will relatively increase in the exposure process of the photolithography. It causes the critical dimension (CD) having a large swing, i.e., changing to large degree in the proceeding of manufacturing process, it also leads to incorrect pattern transfer of the photolithography process.

Referring to FIG. 1A~1E, show cross-sectional views depicted from selected process stages of a conventional procedure used in solving this problem. At first, referring to FIG. 1A, shown a substrate 100. A thin film 101 is formed over the substrate 100 and the thin film 101 is intended for proceeding of the photolithography process. The thin film 101 is made of any kind of materials which are necessary for defining patterns in photolithography process, for example, a polysilicon layer or tungsten silicide.

Next, referring to FIG. 1B, the thin film 101 is coated with an anti-reflection layer (ARL) 104. The anti-reflection layer 104 is made of mineral materials, which can absorb a portion of the light and decrease the reflection coefficient of the thin film while proceeding the manufacture process. The method of decreasing the reflection coefficient of the thin film can be performed by, for example, adjusting the thickness of the anti-reflection layer 104. The method also can be performed by adjusting the features of the anti-reflection layer 104, for example, by changing the reflective index or degree of the absorption, of the anti-reflection layer 104, to a destructive interference degree. By the above-mentioned adjusting methods, the critical dimension (CD) is maintained in a stable condition, by which the pattern transfer of the photolithography process can avoid incorrectness.

After that, referring to FIG. 1C, the anti-reflection layer 104 is defined by photolithography and etching process using a photoresist layer as a mask and is changed into a anti-reflection layer 104a. Next, referring to FIG. 1D, by using the anti-reflection layer 104a as a hard mask the thin film 101 is etched and changed into a thin film 110a. Finally, referring to FIG. 1E, the anti-reflection layer 104a is eliminated and the desired thin film is formed.

According to the conventional method, using the anti-reflection layer 104 to decreasing the reflection coefficient of the thin film is performed by an another complex method. That is, the device has to be moved to another machine from the original machine. It causes the process more complex and, for forming the anti-reflection layer, the original thin film 101 possible to be damaged in the manufacturing process.

Furthermore, the material of the anti-reflection layer 104 is not conductive and is quite different from the original thin film 101, therefore, the thin film 101 requires being defined after the anti-reflection layer. That is, the transfer pattern of the thin film 101 is completed after the transfer pattern of the anti-reflection layer 104. Moreover, when the transfer pattern of the thin film 101 is performed, the defined anti-reflection layer 104 has to be eliminated. Therefore, the conventional method, by forming a anti-reflection layer to decrease a reflection coefficient of the thin film, makes the procedure of the manufacturing more complex. Furthermore, if the residual anti-reflection layer 104 is not eliminated completely, the resistance of the device will increase, even forming open condition. These defects cause the yield rate of the manufacturing reduced.

SUMMARY OF THE INVENTION

It is therefore an objective of the present invention to provide a method in which reflection coefficient of a thin film used for a photolithography process can be efficiently reduced. The formed thin film in this invention possesses a feature of anti-reflection. An additional anti-reflection layer used in a conventional technique is retrenched. Furthermore, it does not need to change the manufacturing machines for completing the process.

It is another an objective of the present invention to provide a method in which reduces the complexity of the process, in addition, it avoids the defects caused by the residuals of the anti-reflection layer.

In accordance with the foregoing and other objectives of the present invention, a manufacturing method for a poly film with an anti-reflection rough surface is provided. The method comprises steps of, at first, a thin film is formed over a substrate, and a amorphous silicon layer is formed over the thin film. Next, in situ a first annealing procedure is performed over the amorphous silicon layer. The amorphous silicon layer is changed into a polysilicon layer with the anti-reflection rough surface.

Next, in situ a second annealing procedure is selectively performed. The polysilicon layer with the anti-reflection rough surface is doped by reacting with a gas induced. Then, the thin film and the polysilicon layer with the anti-reflection rough surface is defined, whereby the poly film with an anti-reflection rough surface is formed over the substrate.

In accordance with the foregoing and other objectives of the present invention, a another method for a poly film with an anti-reflection rough surface is provided. The method comprises steps of, at first, a first doped amorphous silicon layer is formed over a substrate, and an amorphous silicon layer is formed over the first doped amorphous silicon layer.

Next, a first annealing procedure is performed, wherein the first doped amorphous silicon layer is changed into a first doped polysilicon layer, and the amorphous silicon layer is changed into a polysilicon layer with the anti-reflection rough surface. Next, a second annealing procedure is selectively performed, wherein the polysilicon layer with the anti-reflection rough surface is doped by reacting with a gas induced, and the polysilicon layer with the anti-reflection rough surface is changed into a second doped polysilicon layer. The first doped polysilicon layer and the second polysilicon layer with the anti-reflection rough surface is defined, whereby the poly film with an anti-reflection rough surface is formed over the substrate.

In conclusion, the invention has the following features:

1. By the rough-surface polysilicon layer, most of the light of the source can be absorbed, the reflection coefficient can be easily decreased.

2. The rough-surface polysilicon layer can be formed directly in the same chamber of a machine. It is more convenient than the conventional method in which a anti-reflection layer is formed in an another machine, not in situ.

3. Constitutions of the polysilicon layer and the doped polysilicon layer are all the same, an additional etching process is unnecessary for defining the pattern. It makes the manufacturing process more convenient.

4. Because the doped polysilicon layer is conductive, the doped polysilicon layer does not need to be eliminated, by which some of steps of the manufacturing process can be omitted. The problem caused by the residuals of the anti-reflection layer can be avoided.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new method in which reflection coefficient of a thin film used for a photolithography process can be efficiently reduced. The formed thin film in this invention possesses a feature of anti-reflection. An additional anti-reflection layer used in a conventional technique is retrenched. Furthermore, it does not need to change the manufacturing machines for completing the process.

The other object of the present invention is to provide a method in which reduces the complexity of the process, in addition, it avoids the defects caused by the residuals of the anti-reflection layer.

Hereafter is a preferred embodiment of this invention, in which manufacture steps of a polysilicon layer with a rough surface are introduced. The polysilicon layer with a rough surface is used for an anti-reflection layer. However, the scope of the invention is not restricted in using the polysilicon as materials of the thin layer with a feature of anti-reflection.

Figure 1A:
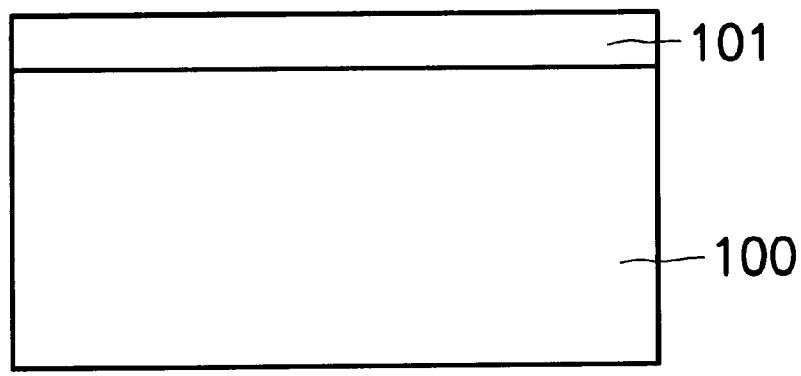
FIGS. 1A to 1E are cross-sectional views depicted from selected process stages of a conventional procedure forming a anti-reflection layer to decrease a reflection coefficient of the thin film.
Figure 1B:
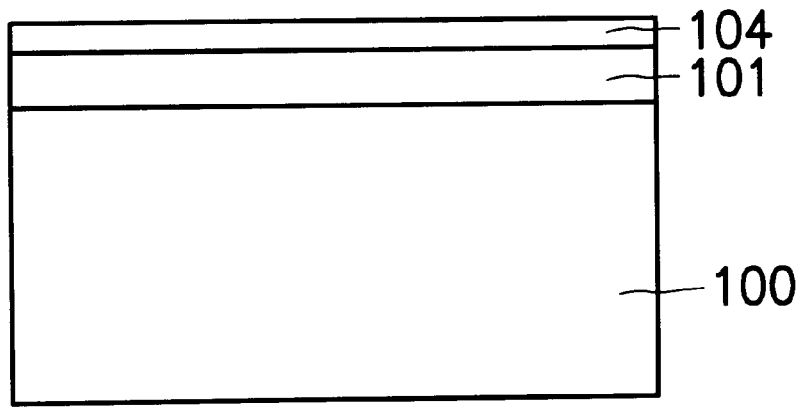
Figure 1C:
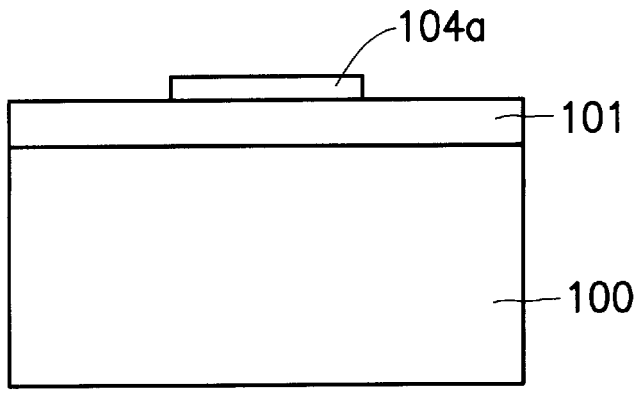
Figure 1D:
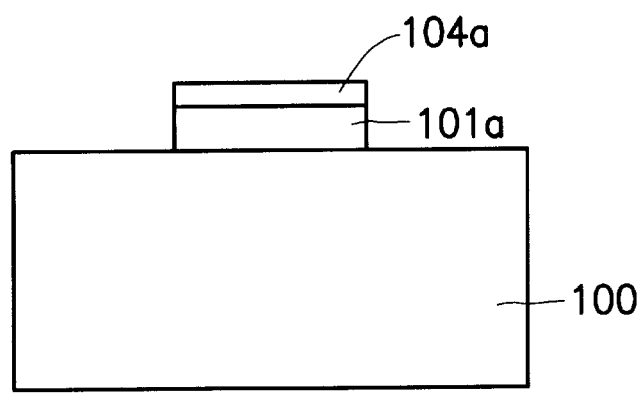
Figure 1E:
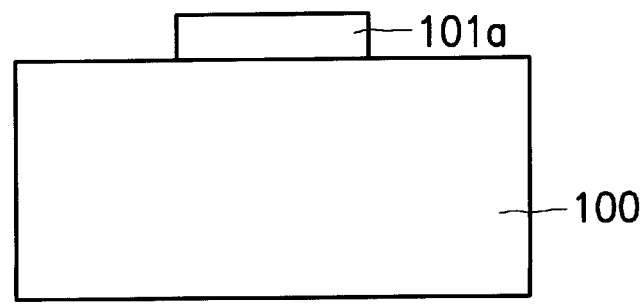
Figure 2A:
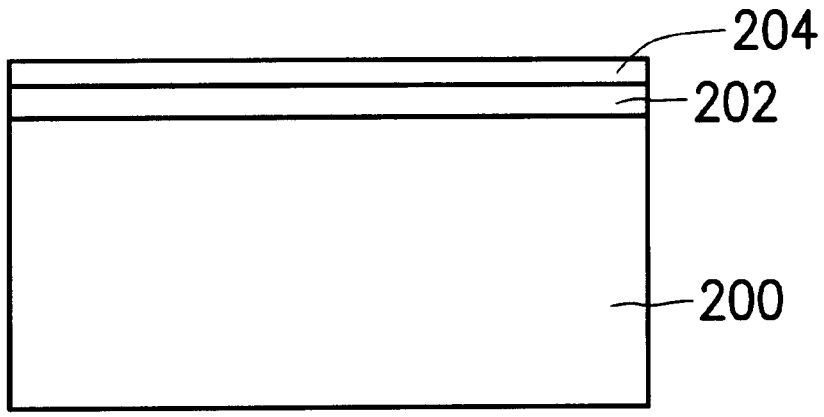
FIGS. 2A to 2D are cross-sectional views depicted from selected process stages of a procedure in accordance with a preferred embodiment of the invention which a thin film used for a photolithography process with rough-surface is produced for decreasing a reflection coefficient of the thin film.

At first, referring to FIG. 2A, shown a substrate 200, on which a doped amorphous layer 202 is formed by, for example, a multi-chamber rapid thermal chemical vapor deposition. In situ an undoped amorphous layer 204 of about 50~200 Å is deposited over the doped amorphous layer 202.

Figure 2B:
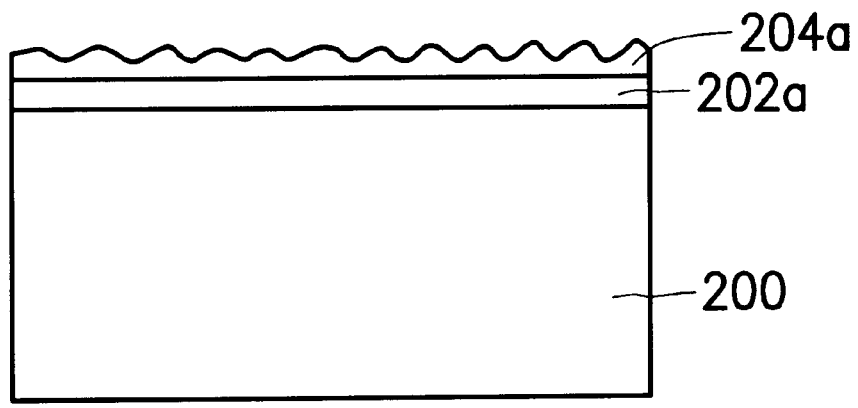

Next, referring to FIG. 2B, in situ a first annealing procedure is employed at a temperature in a range of about 635° C.~655° C. in the same depositing chamber. After that, the doped amorphous layer 202 is changed into a doped polysilicon layer 202a. The undoped amorphous layer 204 is changed into a rough-surface polysilicon layer 204a. The rough-surface polysilicon layer 204a has a feature of anti-reflection owing to the rough surface of the rough-surface polysilicon layer 204a. Because of the feature of anti-reflection, the rough-surface polysilicon layer 204a can absorb most light of source. An additional anti-reflection layer, which is used in the conventional process, is not necessary.

Figure 2C:
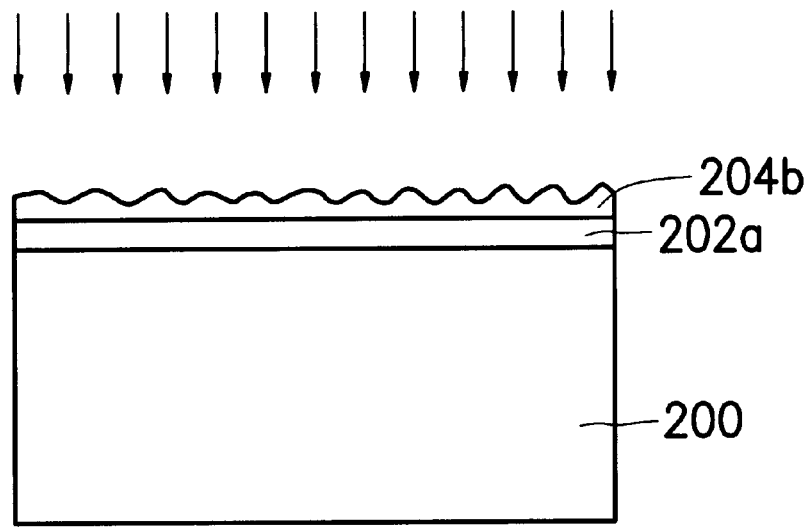

Next, referring to FIG. 2C, in situ a second annealing procedure is employed in the same chamber. The rough-surface polysilicon layer 204a is changed into a doped polysilicon layer 204b with a rough surface. The preferred embodiment of the second annealing procedure is performed by inducing a 2%~3% phosphoric gas, for example, a $PH_3$ gas into the chamber at a pressure of about 30~300 torr at a temperature of about 950° C.~1050° C. The induced gas comprises components which could be used as impurities for doping the rough-surface polysilicon layer 204a. Therefore, after the high-temperature second annealing procedure, particles cracked from the reaction gas are automatically driven into the rough-surface polysilicon layer 204a. The rough-surface polysilicon layer 204a is changed into a doped polysilicon layer 204b. The doping is performed at the same time as the second annealing procedure proceeds. It is very simple and easy during the process.

Figure 2D:
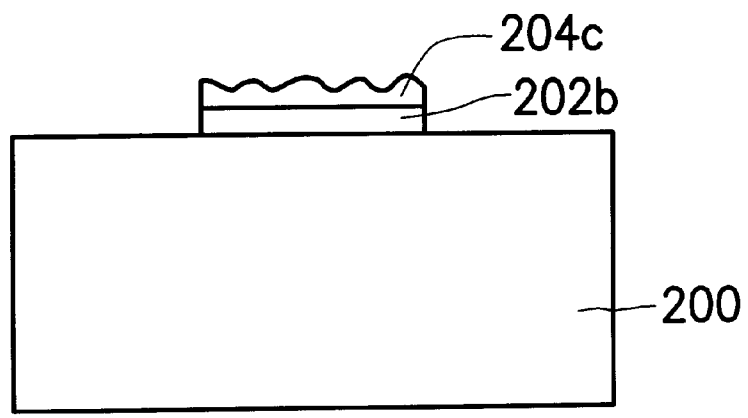

Finally, referring to FIG. 2D, the polysilicon layer 202a and the doped polysilicon layer 204b is defined by a photolithography and etching process. Then portions of the polysilicon layer 202a and the doped polysilicon layer 204b are changed into a polysilicon layer 202b and the doped polysilicon layer 204c. Because constitutions of which the polysilicon layer 202b and the doped polysilicon layer 204c are made are all the same, an additional etching process is unnecessary for defining the pattern. It makes the manufacturing process more convenient. In addition, because the doped polysilicon layer 204c is conductive, the doped polysilicon layer 204c does not need to be eliminated, by which some of steps of the manufacturing process can be omitted. The problem caused by the residuals of the anti-reflection layer can be avoided.

According to the above-described, the method of the embodiment is that a thin polysilicon layer with rough surface is formed above the substrate to be a thin film of the photolithography process. An additional anti-reflection layer used in the conventional process is no more needed. By the rough-surface polysilicon layer, most of the light of the source can be absorbed, a object of decreasing the reflection coefficient can be easily performed.

According to the embodiment, features of the invention can be understood as followed:

1. By the rough-surface polysilicon layer, most of the light of the source can be absorbed, the reflection coefficient can be easily decreased.

2. The rough-surface polysilicon layer can be formed directly in the same chamber of a machine. It is more convenient than the conventional method in which a anti-reflection layer is formed in an another machine, not in situ.

3. Constitutions of the polysilicon layer 202b and the doped polysilicon layer 204c are all the same, an additional etching process is unnecessary for defining the pattern. It makes the manufacturing process more convenient.

4. Because the doped polysilicon layer 204c is conductive, the doped polysilicon layer 204c does not need to be eliminated, by which some of steps of the manufacturing process can be omitted. The problem caused by the residuals of the anti-reflection layer can be avoided.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A manufacturing method for a poly film with an anti-reflection rough surface, comprising:

providing a substrate, wherein a thin film is formed over the substrate, and an amorphous silicon layer is formed over the thin film;

in situ performing a first annealing procedure over the amorphous silicon layer, wherein the amorphous silicon layer is changed into a polysilicon layer with the anti-reflection rough surface;

in situ selectively performing a second annealing procedure, wherein the polysilicon layer with the anti-reflection rough surface is doped by reacting with a gas induced; and defining the thin film and the polysilicon layer with the anti-reflection rough surface, whereby the poly film with an anti-reflection rough surface is formed over the substrate.

2. The method of claim 1, wherein the thin film comprises a doped amorphous layer, and the doped amorphous layer is changed into a doped polysilicon layer.

3. The method of claim 1, wherein the thin film comprises a tungsten silicide layer.

4. The method of claim 1, wherein the thickness of the amorphous silicon layer is about 50~200 Å.

5. The method of claim 1, wherein the first annealing procedure is performed at a temperature of about 635° C.~655° C.

6. The method of claim 1, wherein the induced gas comprises a phosphoric gas.

7. The method of claim 6, wherein the phosphoric gas comprises 2%~3% $PH_3$.

8. The method of claim 1, wherein the second annealing procedure is performed at a temperature of about 950° C.~1050° C.

9. A manufacturing method for a poly film with an anti-reflection rough surface, comprising:

providing a substrate, wherein a first doped amorphous silicon layer is formed over the substrate, and a amorphous silicon layer is formed over the first doped amorphous silicon layer;

in situ performing a first annealing procedure, wherein the first doped amorphous silicon layer is changed into a first doped polysilicon layer, and the amorphous silicon layer is changed into a polysilicon layer with the anti-reflection rough surface;

in situ selectively performing a second annealing procedure, wherein the polysilicon layer with the anti-reflection rough surface is doped by reacting with a gas induced, and the polysilicon layer with the anti-reflection rough surface is changed into a second doped polysilicon layer; and defining the first doped polysilicon layer and the second polysilicon layer with the anti-reflection rough surface, whereby the poly film with an anti-reflection rough surface is formed over the substrate.

10. The method of claim 9, wherein the first doped amorphous silicon layer and the amorphous silicon layer is formed in a same depositing system.

11. The method of claim 10, wherein the depositing system is a chemical vapor deposition system.

12. The method of claim 9, wherein the thickness of the amorphous silicon layer is about 50~200 Å.

13. The method of claim 9, wherein the first annealing procedure is performed at a temperature of about 635° C.~655° C.

14. The method of claim 9, wherein the induced gas comprises a phosphoric gas.

15. The method of claim 14, wherein the phosphoric gas comprises 2%~3% $PH_3$.

16. The method of claim 15, wherein the second annealing procedure is performed at a temperature of about 950° C.~1050° C.

* * * * *